(12) United States Patent
Comtois et al.

(10) Patent No.: US 6,322,374 B1
(45) Date of Patent: Nov. 27, 2001

(54) MICRO-ZERO INSERTION FORCE SOCKET

(75) Inventors: John H. Comtois, Reston, VA (US); James C. Lyke, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/627,602

(22) Filed: Jul. 28, 2000

(51) Int. Cl.[7] ............................................. H05K 1/00
(52) U.S. Cl. ........................ 439/75; 439/69; 439/74
(58) Field of Search .................... 439/74, 75, 69

(56) References Cited

U.S. PATENT DOCUMENTS 5,372,512 * 12/1994 Wilson et al. ..................... 439/67
5,454,904 * 10/1995 Ghezzo et al. ..................... 216/13
5,632,631 * 5/1997 Fjelstad et al. ..................... 439/82
6,171,114 * 1/2001 Gillette et al. ..................... 439/67

OTHER PUBLICATIONS

James C. Lyke, Robert Wojnarowski, Glenn A. Forman, Richard Saia, and Bernard Gorowitz, "Three Dimensional Patterned Overlay High Density Interconnect (HDI) Technology", *Journal of Microelectronic Systems Integration*, vol. 1(3), 1993.

* cited by examiner

*Primary Examiner*—Tho D. Ta
*Assistant Examiner*—Ann McCamey
(74) *Attorney, Agent, or Firm*—Kenneth E. Callahan

(57) ABSTRACT

A micro-zero insertion force socket is fabricated capable of connecting pins with diameters of 25 to 200 microns and minimum pitches of from 3:1 to 10:1 using microfabrication techniques, MEMS components, and high-density interconnections.

4 Claims, 9 Drawing Sheets

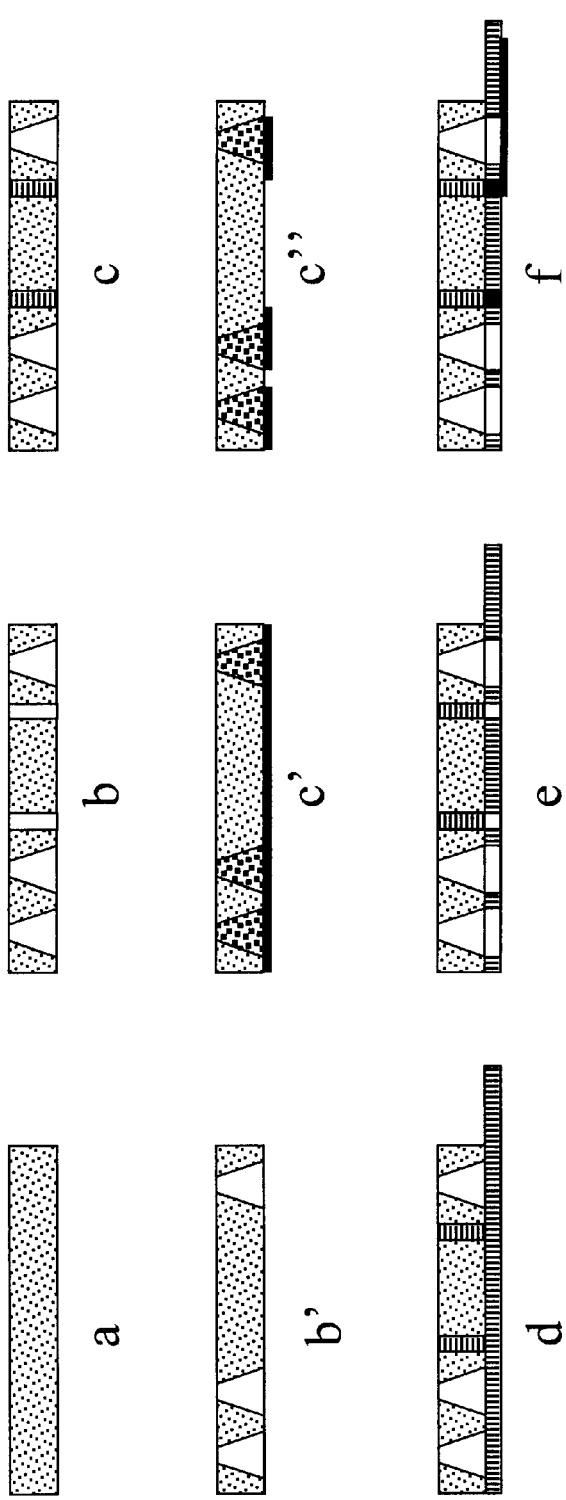
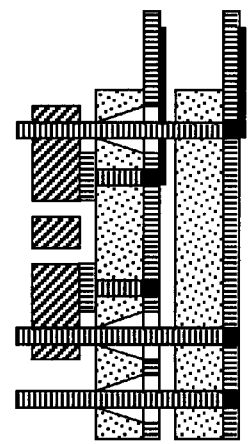
FIG. 3
FIG. 4
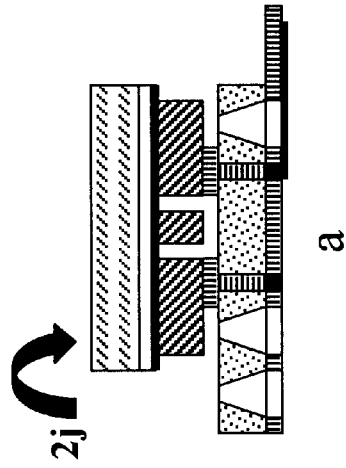
FIG. 5

MICRO-ZERO INSERTION FORCE SOCKET

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The present invention is in the field of light to zero insertion force sockets, and in particular relates to a high-density electrical socketing approach based on a combination of micro-fabrication techniques.

2. Description of the Prior Art

Connectors can be thought of as a serviceable attachment of conductor arrays on opposing surfaces of two compatible components. The insertion force requirement and the necessity of aligning many pins fundamentally limit the density of connectors. The present invention addresses primarily the insertion force issue.

Typical pin-based connector assemblies rely on the interference fit of a plug structure containing an array of pins into a receptacle assembly with a matching array of mating socket receptacles for each pin. The act of fitting these pieces together accomplishes two things: (1) a mechanical attachment and (2) a scrubbing action to improve electrical attachment of pins to receptacles. The force requirements for the interference fit clearly scales as the number of pins increase. In extreme cases, electronics packages have been constructed that may feature as many as 1,900 pins. In some cases the compressive force can be hundreds of pounds and in fact attempting to remove such packages can result in the destruction of the associated components that comprise an assembly.

There have been three general responses to the insertion force issue: (1) solder, (2) alternate contact systems, and (3) low insertion force (LIF)/zero insertion force (ZIF) sockets.

Solder assemblies, such as ball grid array (BGA) interface, avoid the insertion force issue altogether by solder attaching the mating conductors of two opposing surfaces. The solder attachment though makes serviceability difficult or impossible.

A second approach involves using a compliant contact system, such as an interposer, to interface identical arrays of flat conductors (no pins or receptacles) on the opposing surfaces. The interposer is a compressible conductor array that is sandwiched between the opposing conductor arrays. The electrical contact is effected by fastening the opposing surfaces together with sufficient force to compress the interposer, ensuring good electrical contact. The compressive force can be as high as about two ounces per contact. Compliance in interposer systems is important due to the need to ameliorate tiny discontinuities (called asperities) in the micro-surfaces of individual conductors that prevent perfect contact over an adequate fraction of the conductor surface areas. Interposers also buffer out-of-plane warpage and expansion due to thermal or mechanically induced stresses. While service-ability is gained with interposers, the significant compressive forces require not only strong fasteners but also bulk reinforcement of the mating assemblies, mitigating any density advantages one could hope for.

LIF and/or ZIF sockets are aimed at high serviceability connection settings, such as the central processor unit of a computer motherboard or as sockets for device programmers that may need dozens or hundreds of mating cycles. In the case of the computer motherboard a high number of contacts are involved (approximately 200), and the value of the inserted component is high but the number of insertions is relatively low. Here, LIF/ZIF sockets minimize the potential of damage to the easily bent pins on the package of the component. In device programmers, components often have much lower pin counts (about 40), but the number of socketing operations may be very high, consistent with programming a number of memory chips for production assemblies. The field of LIF/ZIF sockets continues to evolve, especially with the advent of high pin-count field programmable gate array (FPGA) devices and more complex microprocessors, as these drive the need for serviceable socketing approaches. The LIF/ZIF sockets offer a promising solution for high-value components and provide good connection, but they are very bulky, in some cases bulkier than even the interposer approaches. Furthermore, the pitch (distance between conductors) is fairly coarse (about 100 mils), preventing very dense assemblies to be implemented.

The ideal attributes of a high-performance connector would include: (1) low contact resistance; (2) low pitch (for high pin-count); (3) low insertion force; and (4) easy service-ability. It is possible to have some but not all of these attributes in any of the three basic connection approaches described.

The present invention, a micro-zero insertion force ($\mu$ZIF) socket, combines the best attributes of the three basic connection approaches, with minimal disadvantages. Whereas present ZIF systems employ macro-mechanical approaches and are limited to the 50–100 mil pitch range, the present approach can in principle scale down to the 1–5 mil pitch range, theoretically offering as high as a 10,000:1 density advantage. The system relies on influences from microelectromechanical systems (MEMS) and advanced packaging, though other embodiments are possible.

SUMMARY OF THE INVENTION

The micro-zero insertion force socket (MZIFS) is a high-density electrical socket manufactured using micro-fabrication techniques, a microelectromechanical (MEMS) engage/disengage mechanism, and advanced packaging. Attributes include low contact resistance, low pitch (for high pin count), low insertion force, and easy serviceability. The MZIFS mates conductor arrays on two opposing surfaces, a micro-pin array and a micro-receptor array. The conductor arrays use high density interconnect (HDI) technology to permit convenient access of the mating arrays with the host assemblies.

BRIEF DESCRIPTION OF THE DRAWINGS

The various features of novelty that characterize the invention are pointed out with particularity in the claims annexed to and forming a part of this disclosure. For a better understanding of the invention, its operating advantages, and specific objects attained by its uses, reference is made to the accompanying drawings and descriptive matter in which a preferred embodiment of the invention is illustrated.

FIG. 3 depicts the construction of the micro-receptacle array (MRA).

FIG. 4 depicts the attachment of the micro-actuators to the MRA.

FIG. 5 shows the assembled micro-socket in the "engaged" state.

DESCRIPTION OF THE PREFERRED EMBODIMENT

As in the other socketing/connection approaches, a micro zero insertion force ($\mu$ZIF) socket mates conductor arrays on two opposing surfaces. One section is called the micro-pin array (MPA). The receptacle section is referred to as the micro-receptor array (MRA). The MRA has two states: engaged (default) and disengaged (low insertion force condition, which is momentary). The states are effected through an actuation approach that can be manual or automated through, for example, the use of MEMS actuators. Finally, the conductor arrays are redistributed using a high density interconnect technology to permit convenient access of terminals in the high density mating arrays by the host assemblies that employ them.

Figure 1:
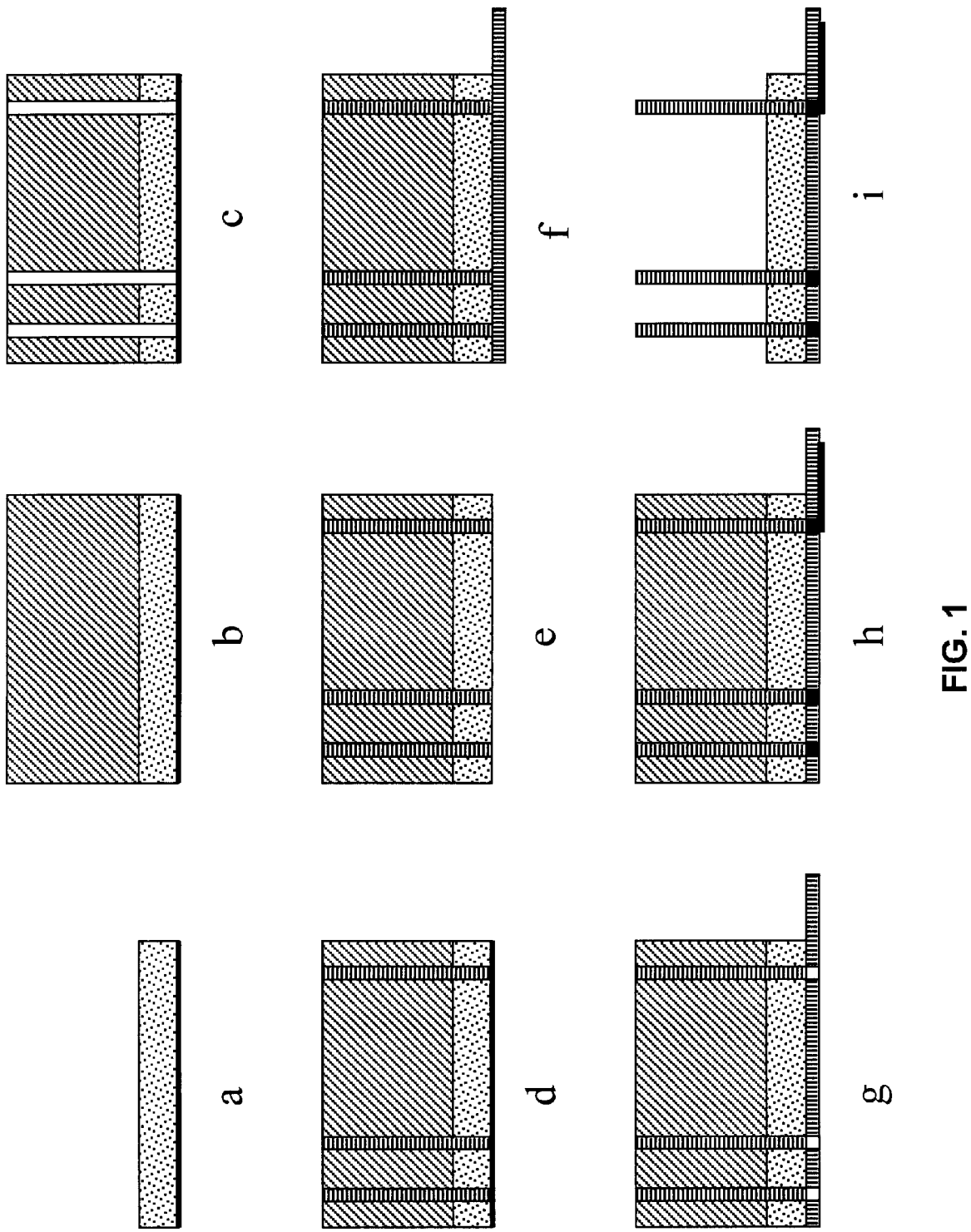
FIG. 1 shows the step-by-step process for forming the connector pins (micro pin array).

The basic embodiment of the present invention is summarized in FIGS. 1–10. FIG. 1 illustrates the construction of the connector pins (a micro pin array). This embodiment requires a substrate and a plating base, shown in FIG. 1a. The substrate is up to 2 millimeters thick and has the plating base layer deposited on its bottom. The substrate can be made of a number of materials, including silicon, glass, Pyrex, ceramic, plastic, polyimide, etc. The primary characteristics of the substrate include a high insulative capability (i.e., it is non-conductive) and reasonable thermal and mechanical stability. The sacrificial material must be easily releasable without compromising the metal pins that are subsequently formed.

FIG. 1b depicts the deposition of a thick layer of photoresist onto the substrate, comparable in thickness to the length of the micro-pins to be formed, i.e., 500–2000 microns. A series of holes are next photolithographically patterned and etched through the photoresist and the substrate (FIG. 1c). The holes are etched down to the plating base to form the mold for electroplating the pins. The holes must be reasonably uniform (within 5 microns throughout). They are the same diameter as the micro-pins to be formed (25–200 microns) and are spaced at a minimum pitch of from 3:1 to 10:1 the size of the pin diameter. The holes themselves can be formed by reactive ion etching/milling, or even mechanical drilling if sufficiently large pins are permitted.

Figure 7A:
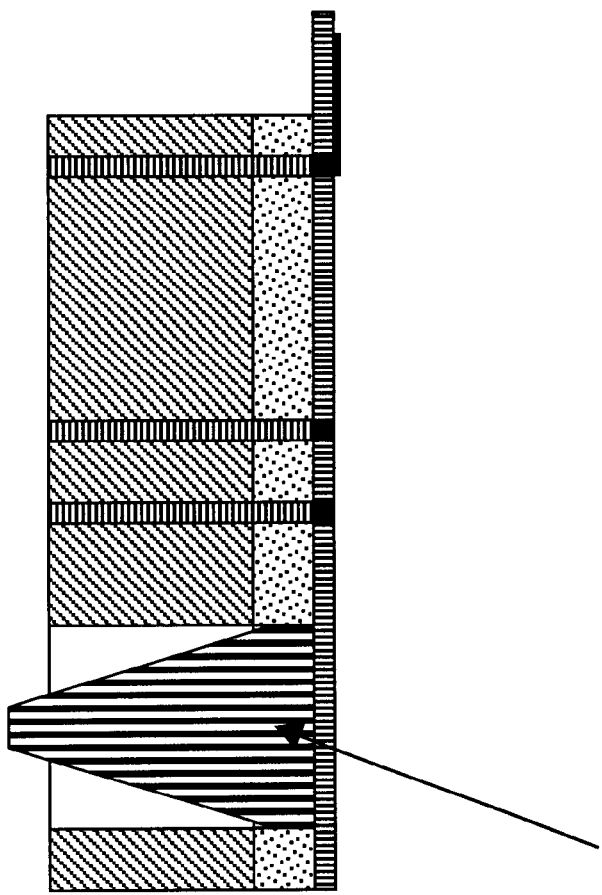
FIG. 7a depicts the primary alignment pin inserted after electroplating and before application of the HDI wiring manifold.
Figure 7B:
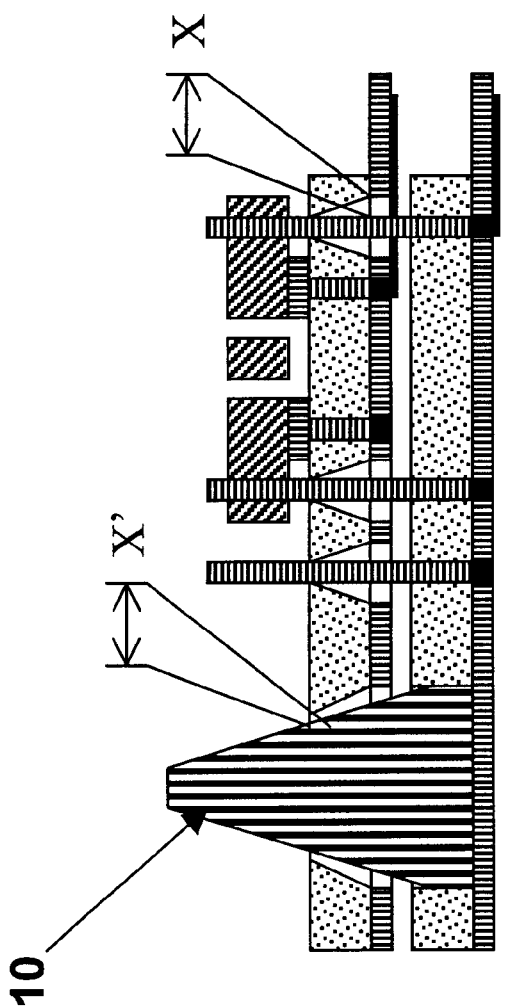
FIG. 7b illustrates the use of tapered holes to improve self-alignment during assembly.

The pins are next formed (FIG. 1d) by electroplating to fill the holes. The pins must penetrate through the entire substrate. The tops of the pins do not have to be polished flat or even grown all the way to the top. There is a wide error margin with respect to the length of the pins, up to several 10's of microns. (FIG. 7b shows that the pin length has plenty of tolerance.)

The plating base is next removed by etching or chemical-mechanical polishing (FIG. 1e) and an insulating layer added in its place for the deposited-metal pin connections and wiring (FIG. 1f). This layer can also form a flexible wiring manifold if needed. This layer can be deposited or be a glued-on sheet. An alternative process for steps 1b–1c is available. The substrate could already have etched holes, then the thick resist is deposited over the top, filling the holes. The plating base (dark line in FIGS. 1b–1d) in this alternate process would be on top of the photoresist (no dark line in FIG. 1a). The substrate now serves as a mask for etching (such as deep RIE) through the photoresist to form the plating molds for the pins. The advantage of this alternate approach is that the etching, laser-drilling, or other hole-forming steps are performed on the hard substrate before the less mechanically sturdy photoresist is added. This also eliminates a masking step since the holes in the substrate serve as the mask. Any taper in the sidewalls of the holes etched into the photoresist would form pins that are wider at the base, which is more desirable than a taper in the opposite direction, towards the tops of the pins. Since the substrate forms the mask, the "photoresist" could be any conveniently etched substance that can serve as an electroplating mold. One disadvantage to this alternate process is that the electroplated material must completely fill the holes and be polished flat on the base of the substrate for joining to the wiring manifold.

Figure 10:
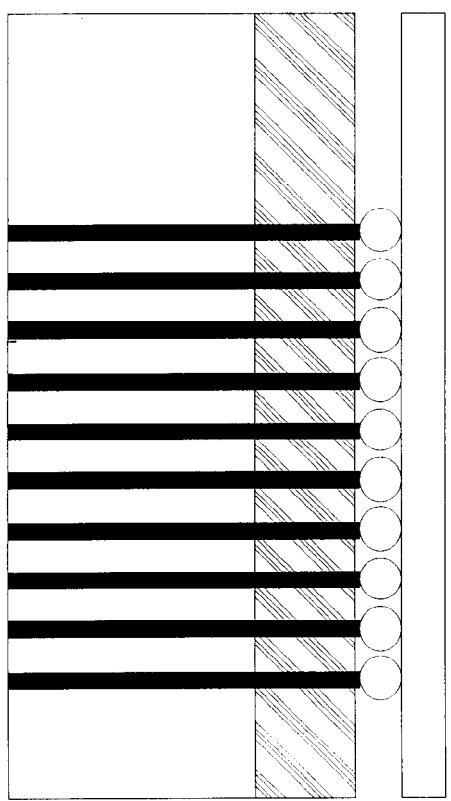
FIG. 10 shows an alternate embodiment of the HDI manifold attachment.
Figure 10:
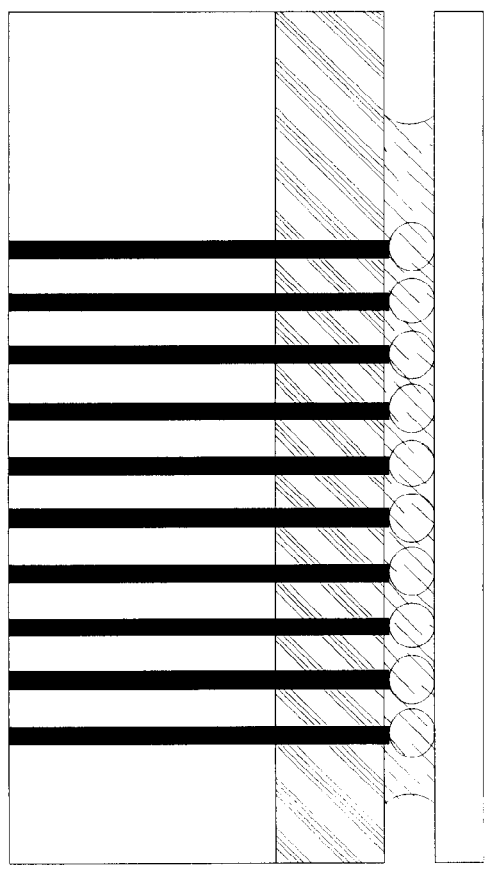
Figure 11:
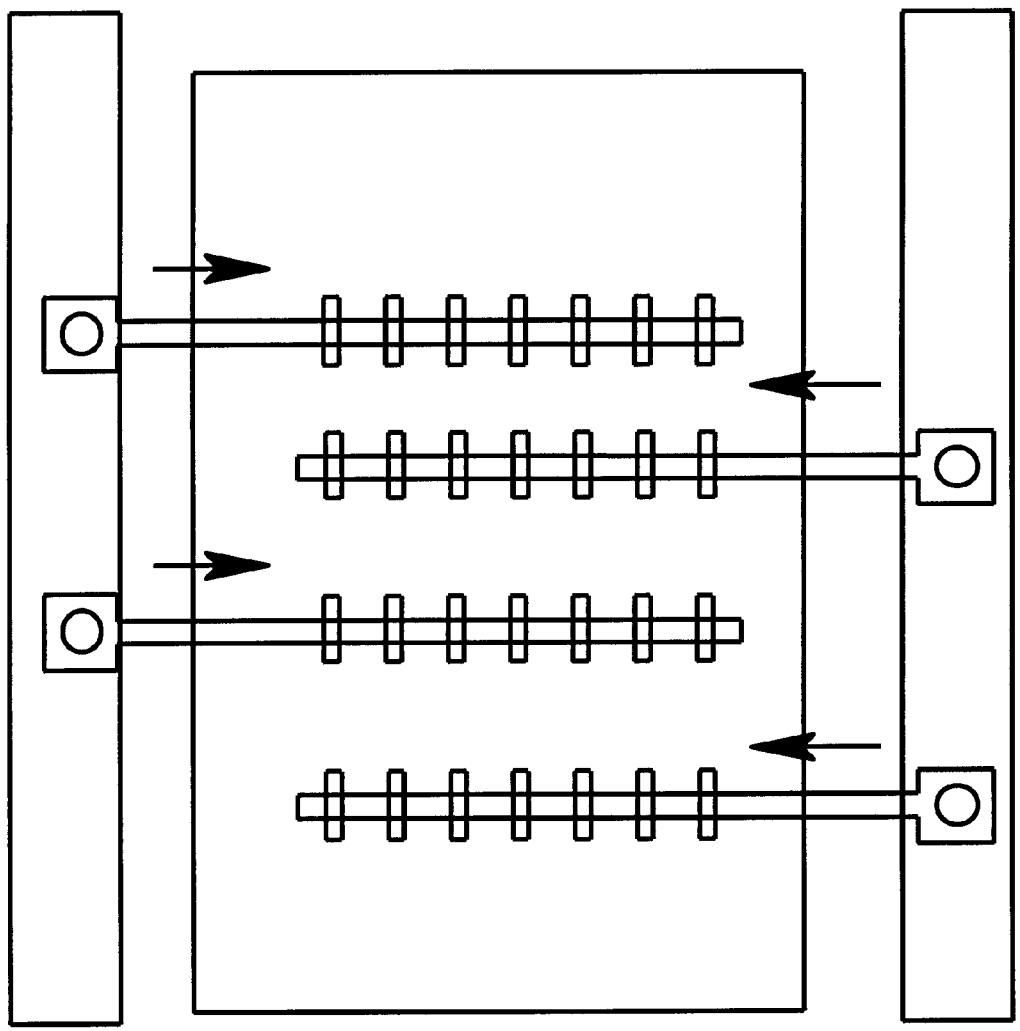
FIG. 11 shows two bars of yokes arranged for manual actuation.

At this point, for the purposes of terminal access, a conductive fanout wiring system is required. A high-density interconnection manifold is fabricated or laminated onto the accessible surface of the substrate. This is envisioned as being a patterned overlay interconnection system (James C. Lyke, Robert Wojnarowski, Glenn A. Forman, Richard Saia, and Bernard Gorowitz, "Three Dimensional Patterned Overlay High Density Interconnect (HDI) Technology", *Journal of Microelectronic Systems Integration*, Vol 1(3), 1993). Steps shown in FIGS. 1e through 1g depicted how a single layer HDI manifold is fabricated directly onto the substrate. Via holes are etched through the wiring insulator to access the conductor pins that are flush with the substrate (FIG. 1g). Then a metal system is formed, typically a Ti—Cu—Ti metal system that is consistent with the high density interconnect (HDI) fabrication process (FIG. 1h). This sequence summarizes only a single-layer HDI system, which can be extended to multiple layers by repeating the steps shown in FIG. 1f–1h, consistent with the practice of HDI, which can form assemblies of as many as ten individual interconnection layers. An alternate embodiment for the HDI manifold allows for the attachment of a pre-fabricated manifold using a solder ball grid array. This is depicted in FIG. 10. The ball grid array is more or less permanently affixed to the substrate, and the attachment can be underfilled if desired (FIG. 10b), consistent with BGA assembly at fine pitch. The photoresist is finally released through the appropriate chemistry, completing the micro pin array (FIG. 1i). As yet another alternative embodiment, a pre-fabricated multi-layer interconnection manifold could be attached with a conductive adhesive, either a patterned array of isotropically conductive adhesive or a layer of z-axis (anisotropically conductive) adhesive. The conductive adhesive performs the same role as the solder BGA.

Figure 2:
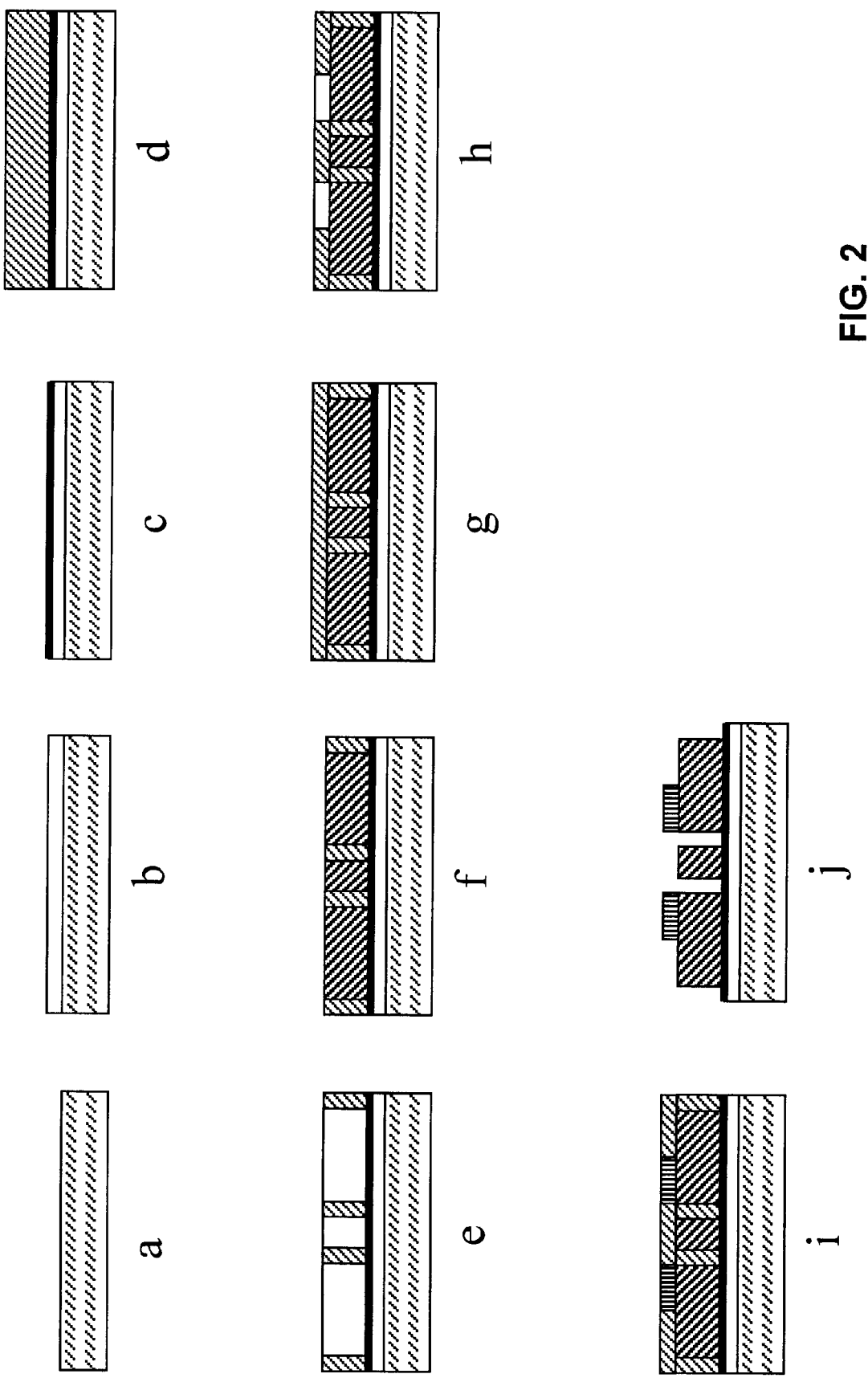
FIG. 2 shows the step-by-step process for forming micro-actuator cantilevers, which have a one-to-one correspondence to each pin.
Figure 6:
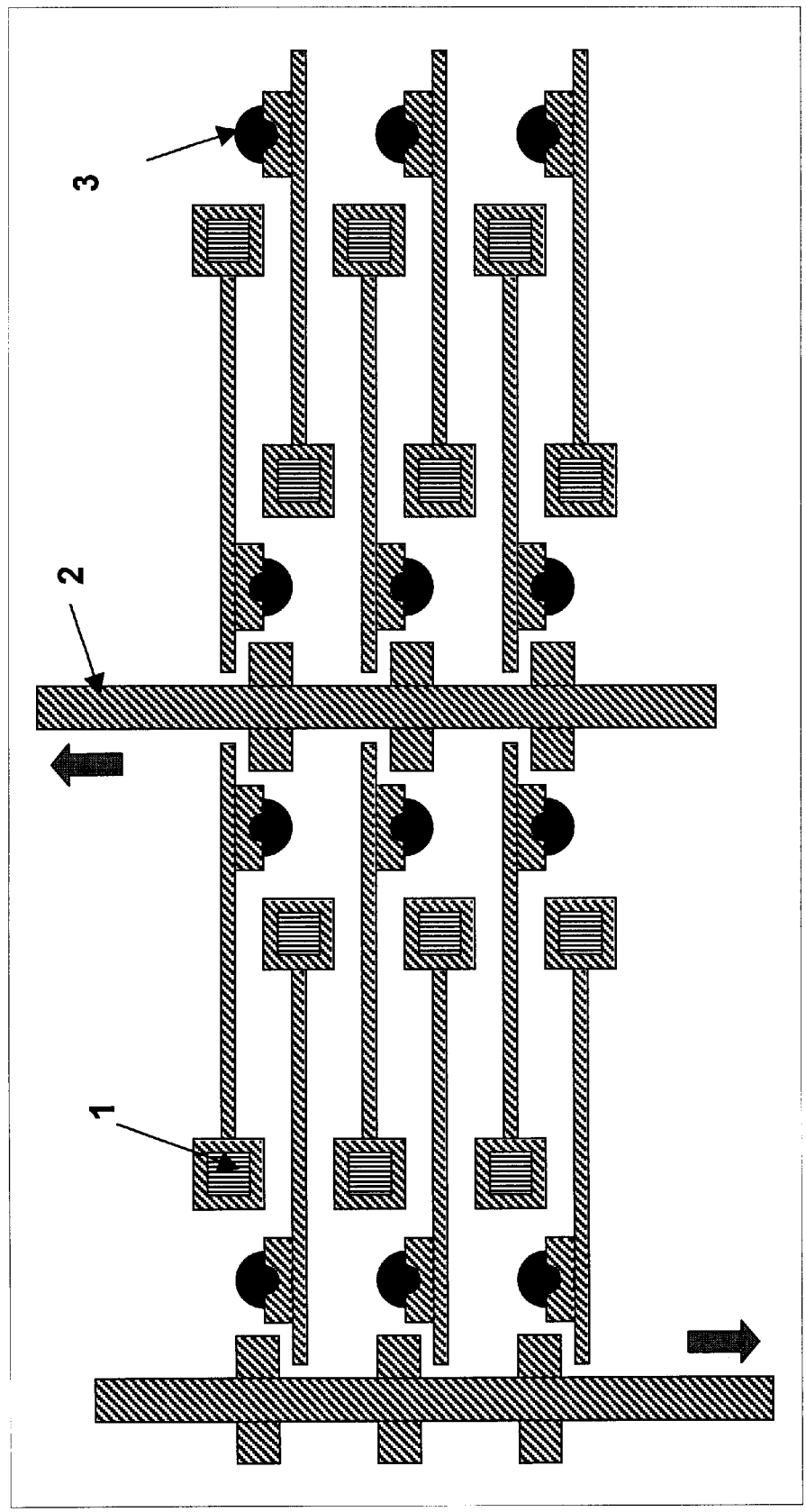
FIG. 6 illustrates the technique for engaging a group of micro-actuators using a series of yokes. This is a top view of the connector die (female side). Each yoke pulls on two columns; the columns are interleaved.

FIG. 2 illustrates formation of the actuator array or mechanical clamps that is part of the micro receptacle array (MRA). In this process flow the clamps are made separately from the guide-hole plate, then the two are joined by bump bonding to form the micro receptacle array (MRA). The substrate on which the mechanical clamps are formed is in the end discarded. The actuator array fabrication also starts with a substrate (FIG. 2a), based on silicon. An easily etched release layer (white) is deposited on the substrate (FIG. 2b). Next a thin (<1 μm) plating base (dark line) is deposited on the substrate (FIG. 2c). A thick layer of photoresist is then deposited on the substrate (FIG. 2d). This working material is photolithographically patterned to form the clamp features (FIG. 2e). (Refer to FIG. 6 for a top view of the crosshatched clamp features. Components to be fabricated in this layer include the clamp arms and yoke bars for pulling on the arms. Not shown in FIG. 6 are tethers and anchors that must be added to the ends of the yoke bars to prevent them from becoming loose in step 4b.)

Next the holes are filled by electroplating (FIG. 2f), forming the clamps and yokes. The holes are overfilled and the metal polished back to get a planar upper surface. In FIG. 2g, another layer of photoresist is deposited, thick enough to form the bump-bonds. A bonding-bump is patterned over the base of each clamp arm in FIG. 2h. (These are the squares shaded with vertical lines in FIG. 6.) The bump-bonding material is then deposited using either electroplated metal or paste (FIG. 2i). The last step for fabricating the mechanical clamps is to remove all remaining photoresist (FIG. 2j). This leaves the clamp features attached via the plating base to the sacrificial substrate.

FIG. 3 illustrates fabrication of the micro-receptacle array (MRA). The guide-hole plate and clamp arm wiring manifold requires forming tapered guide holes, through-vias, and deposited metal wiring. This process starts with a substrate (FIG. 3a) that is dielectric/insulative in nature (about 100–500 microns thick). The substrate is patterned with two types of holes: pinholes and receptacle-actuator contacts (FIG. 3b). The pinholes are tapered, whereas the receptacle-actuator holes are more or less uniform through the substrate. Next, the pinholes are masked and the receptacle-actuator holes are metallized (filled in), as shown in FIG. 3c. An alternate design could have steps 3b', 3c' and 3c'' replace steps 3b and 3c. The guide-holes would have plated sidewalls so that when the clamps force the pins against the guide hole sides, they make electrical contact there instead of at the clamp. This approach eliminates the need for the electrical vias, and the clamps themselves can be formed of a material chosen for best performance as a spring clamp without regard to electrical contact properties. The bump bonds can likewise be non-conductive. For this alternate design, the plating metal deposited on the underside of the substrate must be patterned to provide pads to connect to the wiring manifold. This modified fabrication flow would be 3a, 3b', 3d, 3e, 3f. Another variation would be to deposit the tapered-hole sidewall metal using the metal deposited for the wiring in step 3f. This second modified fabrication flow would be 3a, 3b', 3c', 3c'', 3d, 3e, 3f.

Process steps shown in FIGS. 3d–3f form an HDI interconnection manifold similar to that used in steps shown for the MPA in figures 1f–1h. The alternate micro-BGA embodiment shown in FIG. 10 also applies only if the height of the solder balls does not interfere with the socket mating operation. We indicate it as a possibility, but the direct formation of the HDI manifold in FIGS. 3d–3f is the preferred embodiment.

FIG. 4 illustrates the completion of the MRA by bump-bonding the micro-actuators to the MRA substrate. The entire clamp actuator assembly (FIG. 2j), including the host substrate, are aligned and attached to the guide-hole (MRA) substrate, as shown in FIG. 4a. The key feature of this assembly is that part of the actuator (which is also the receptacle contact) floats over the pinhole receptacles, blocking a direct insertion. Next, the actuator substrate is released by removing the sacrificial layer deposited in FIG. 2c. At this point the MRA contains the two-state actuators (one for each micro-pin) and the insulator MRA receptacle. Individual MRA contacts are externally accessible through the HDI manifold.

FIG. 5 illustrates how the pins fit through the guide holes and are clamped, i.e., the completely mated assembly. The pins are aligned to the clamps in a 3-stage process. The first stage is via tapered pins on the connector shells. The second stage is via tapered pins fitted to the pin block as shown in FIG. 7a. FIG. 7a depicts the use of gross alignment pins 10, which are intended to align and constrain the MPA as it is inserted into the MRA. Since the individual MPA pins are small and delicate, the large pins are intended to improve the mechanical robustness of the overall MPA assembly. The gross pins are inserted during the formation of the MPA between the steps shown in FIG. 1e and FIG. 1f, and are to be arranged in a way that would protect the small MPA pins when the MPA rests on a flat surface (not assembled to an MRA). FIG. 7b depicts details of the geometry of the taper. It is necessary that the misalignment of the seated gross pin be less than ½ the alignment requirement of a micro-pin. The pins themselves perform the third stage of the alignment as they pass into the tapered guide holes. After the pins are seated, the clamps are engaged.

Each micro-pin is held in place by an individual micro-actuator in an interference fit. In order for the mating operation to occur, it would be necessary to disengage all receptacle contacts at once, since the actuators normally block the pinholes. At this point it is possible to insert the MPA into the MRA without interference. The actuator-contacts can then be released, which causes the actuators to clamp onto the pins, which now block the path the actuators would normally have been restored to. This is the essential mechanism through which all contacts between the mating assemblies are formed. Separating the assemblies is simply the reverse of this procedure. Once again the MRA is disengaged, allowing the MPA and MRA to be separated. After separation, the MRA is allowed to return to its default (engaged) state.

FIG. 6 provides a better view of the actuators and the pinholes in the MRA. The figure is a top view of the connector die (female side). Each yoke pulls on two columns; the columns are interleaved. A bonding bump 1, a yoke 2, and a clamped pin 3 are indicated. Since each individual pin has a pinhole and an actuator, it is necessary to establish a technique for simultaneously disengaging all actuators at once. This is done through the use of yokes. A series of yokes intercolate the actuator cantilevers such that moving the yoke causes an entire column of actuators to move. Since the default condition is defined to be the case where the actuator actually blocks part of the pinholes (FIG. 6 is shown in this condition), it is possible to unblock these holes only by actively moving all yokes. The actuation of the yokes can be done by manual force. One way this is achievable is to aggregate two banks of yokes as shown in FIG. 1 onto large bars, one above and one below the entire MRA. If the bars are squeezed inward manually, all yokes and therefore all individual actuators are engaged. Through spring forces, the actuators return the yokes and bars to the default position when released.

Figure 8:
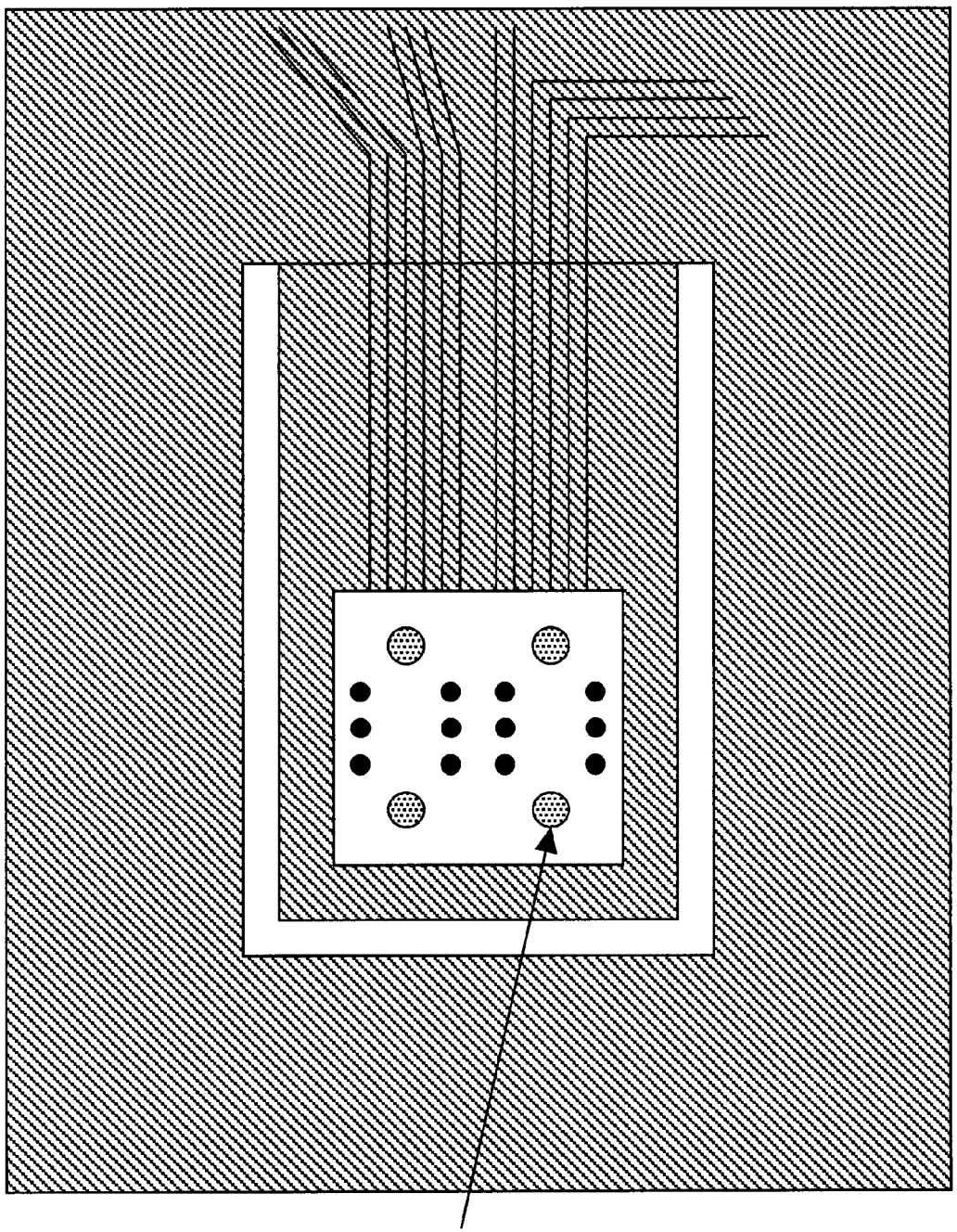
FIG. 8 shows the notional wiring manifold for a cantilever-sprung pin set.

FIG. 8 depicts a top view of the MPA as fabricated in HDI showing a notional wiring manifold for a cantilever-spring pin set. Since the micro-pins are intended to be a very fine pitch, the HDI manifold serves as a physical translation adapter, spreading out the conductor distribution as required in a host assembly (an assembly utilizing an MPA).

Figure 9:
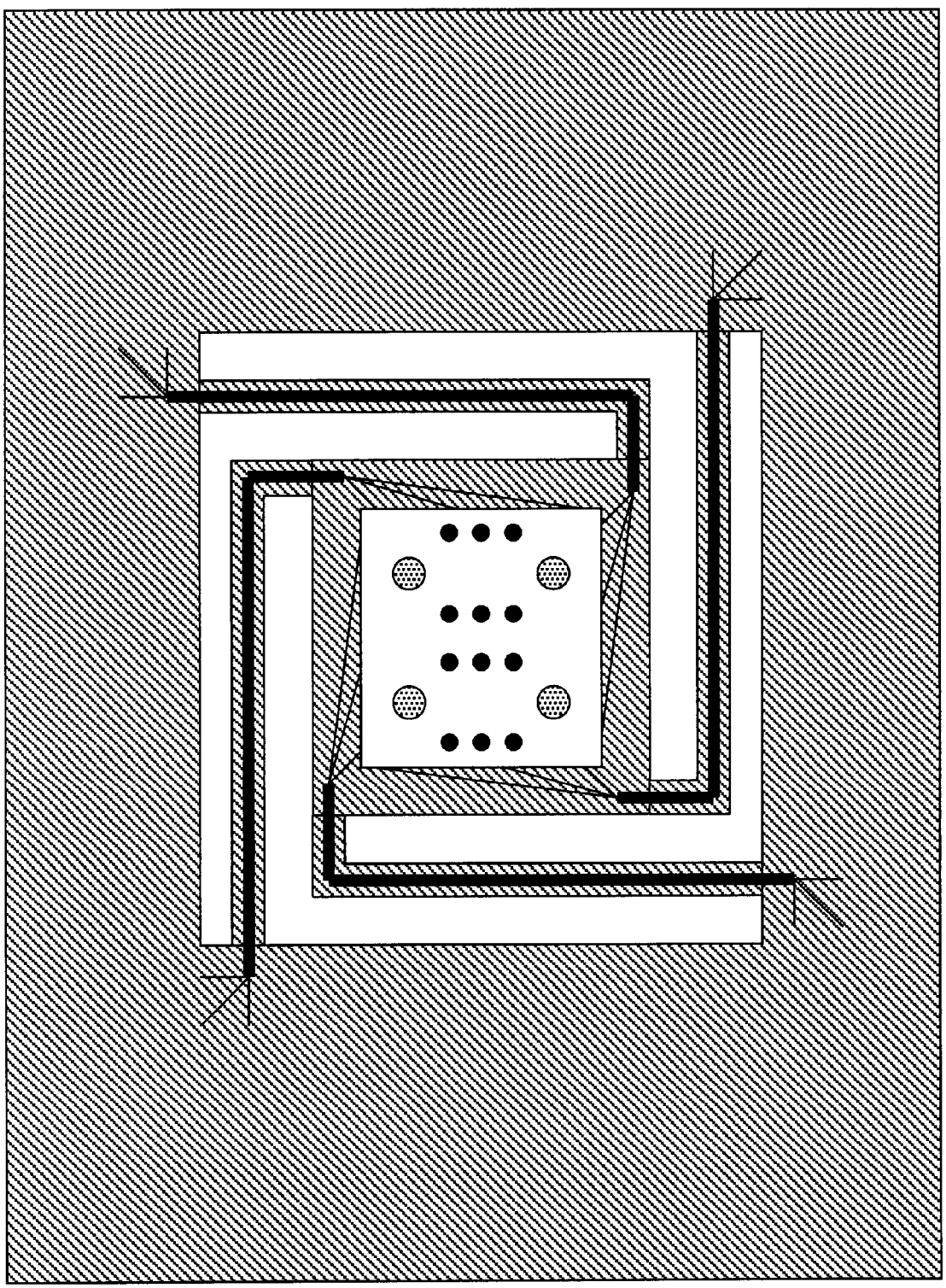
FIG. 9 shows the notional wiring manifold for a spiral-sprung pin set.

FIG. 9 depicts a top view of the MRA. In this case, part of the kapton overlay (added in FIG. 3c) is removed to create an assembly that can move the MRA slightly to accommodate mating alignment. The HDI manifolds provide the outside connections to individual pins on the micro-ZIF socket in both cases.

We claim:

1. A micro-zero insertion force socket comprised of:
   a. a micro-pin array comprised of pins having a range of 25 to 200 microns diameter spaced at a minimum pitch of 3:1 to 10:1 times the diameter of each said pin, a plurality of gross alignment pins, and a patterned overlay, high-density interconnection (HDI) manifold to provide electrical connections between said pins and a first host assembly;
   b. a micro-receptacle array comprised of a guide-hole plate for receiving the pins of said micro-pin array and containing a plurality of tapered gross alignment pin receptacles, means for mechanically clamping said pins after insertion, and a high-density interconnection manifold to provide electrical connections between said means for mechanically clamping said pins and a second host assembly, said means for mechanically clamping being electrically conducting.

2. The micro-zero insertion force socket of claim 1, wherein said means for mechanically clamping said pins is comprised of individual micro-actuators for each of said pins, said micro-actuators connected to yokes such that all micro-actuators can be moved as one to engage or disengage said pins, using either a manual operation, as in large-scale conventional zero insertion force sockets, or automatically using a MEMS-based actuation principle to supply the necessary force.

3. The micro-zero insertion force socket of claim 1, wherein a pre-fabricated manifold attached using a solder ball grid array is substituted for said HDI manifold to provide electrical connections between said pins and a first host assembly.

4. The micro-zero insertion force socket of claim 1, wherein a pre-fabricated manifold attached using a conductive adhesive is substituted for said HDI manifold to provide electrical connections between said pins and a first host assembly.

* * * * *